US007269819B2

(12) United States Patent
Hoshino

(10) Patent No.: US 7,269,819 B2
(45) Date of Patent: Sep. 11, 2007

(54) METHOD AND APPARATUS FOR GENERATING EXPOSURE DATA

(75) Inventor: Hiromi Hoshino, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 506 days.

(21) Appl. No.: 10/973,270

(22) Filed: Oct. 27, 2004

(65) Prior Publication Data

US 2005/0271956 A1 Dec. 8, 2005

(30) Foreign Application Priority Data

Jun. 3, 2004 (JP) ............................. 2004-165901

(51) Int. Cl.
*G06F 17/50* (2006.01)
*G03C 5/00* (2006.01)
(52) U.S. Cl. ........................ 716/21; 430/296
(58) Field of Classification Search ............ 716/19–21; 430/4–5, 296, 942; 250/492.2, 492.22
See application file for complete search history.

(56) References Cited

U.S. PATENT DOCUMENTS 6,543,044 B2 * 4/2003 Inanami et al. ............... 716/21

OTHER PUBLICATIONS

Patent Abstracts of Japan, Publication No. 05-013313, Published Jan. 22, 1993.
Patent Abstracts of Japan, Publication No. 05-182899, Published Jul. 23, 1993.

* cited by examiner

*Primary Examiner*—Paul Dinh
(74) *Attorney, Agent, or Firm*—Staas & Halsey, LLP

(57) ABSTRACT

An exposure data generation method for generating exposure data that can enhance exposure throughput by making the number of shots in each of unit areas where a plurality of charged particle beams are simultaneously applied equal. Layout data is extracted as a plurality of blocks for cell projection exposure. If the number of types of the plurality of blocks for cell projection exposure extracted is greater than a predetermined permissible number, a block for cell projection exposure that is the least effective in performing cell projection exposure is selected from among a plurality of blocks for cell projection exposure included in a unit area where the number of shots calculated is the smallest and the block for cell projection exposure is deleted from all of the unit areas. Variable rectangular exposure is performed for the block for cell projection exposure deleted. Therefore, the number of shots in each of the unit areas on a semiconductor substrate (or reticle) where the plurality of charged particle beams are simultaneously applied is made equal.

14 Claims, 13 Drawing Sheets

UNIT AREA POSITION NUMBER

| | 0 | 1 | 2 | 3 | 4 |
|---|---|---|---|---|---|
| 0 | 57 | 341 | 7832 | 5661 | 54 |
| 1 | 145 | 8492 | 930 | 2241 | 287 |
| 2 | 231 | 1105 | 5589 | 5190 | 356 |
| 3 | 548 | 2778 | 221 | 5572 | 3107 |
| 4 | 108 | 2164 | 4683 | 2840 | 292 |
| 5 | 44 | 3389 | 8905 | 4417 | 117 |
| 6 | 33 | 3221 | 9825 | 1386 | 284 |
| 7 | 79 | 3409 | 6338 | 4020 | 467 |
| 8 | 73 | 478 | 812 | 3478 | 32 |

UNIT AREA ($F_{max}$) IN WHICH NUMBER OF SHOTS IS GREATEST

NUMBER OF SHOTS IN UNIT AREA

UNIT AREA ($F_{min}$) IN WHICH NUMBER OF SHOTS IS SMALLEST

FIG. 3

| CELL PROJECTION BLOCK NUMBER | DELETION FLAG | REDUCTION IN NUMBER OF SHOTS | USE UNIT AREA POSITION NUMBER |
|---|---|---|---|
| 1 | 0 | 145982 | (2,3)(2,6)(4,2)(4,4)(4,6) |
| 2 | 1 | 209381 | (0,8)(1,2)(1,3)(1,6)(2,1)(4,8) |
| 3 | 0 | 1198765 | (1,1)(2,0)(3,0)(3,2)(3,3)(4,3) |
| 4 | 0 | 44298 | (0,6)(0,0)(0,5)(0,6)(4,0) |
| 5 | 0 | 233576 | (0,1)(2,3)(2,6)(4,2)(4,8) |
| 6 | 0 | 4552719 | (0,8)(2,0)(2,2)(3,1)(3,4)(3,5) |
| 7 | 1 | 24573 | (0,5)(0,7)(4,0)(4,1)(4,5) |
| 8 | 0 | 3369192 | (0,2)(0,3)(2,3)(2,6)(4,2)(4,7) |
| 9 | 0 | 9823154 | (0,4)(1,5)(2,0)(2,6)(3,6)(3,7) |

FIG. 4

CELL PROJECTION EXPOSURE METHOD

VARIABLE RECTANGULAR EXPOSURE METHOD

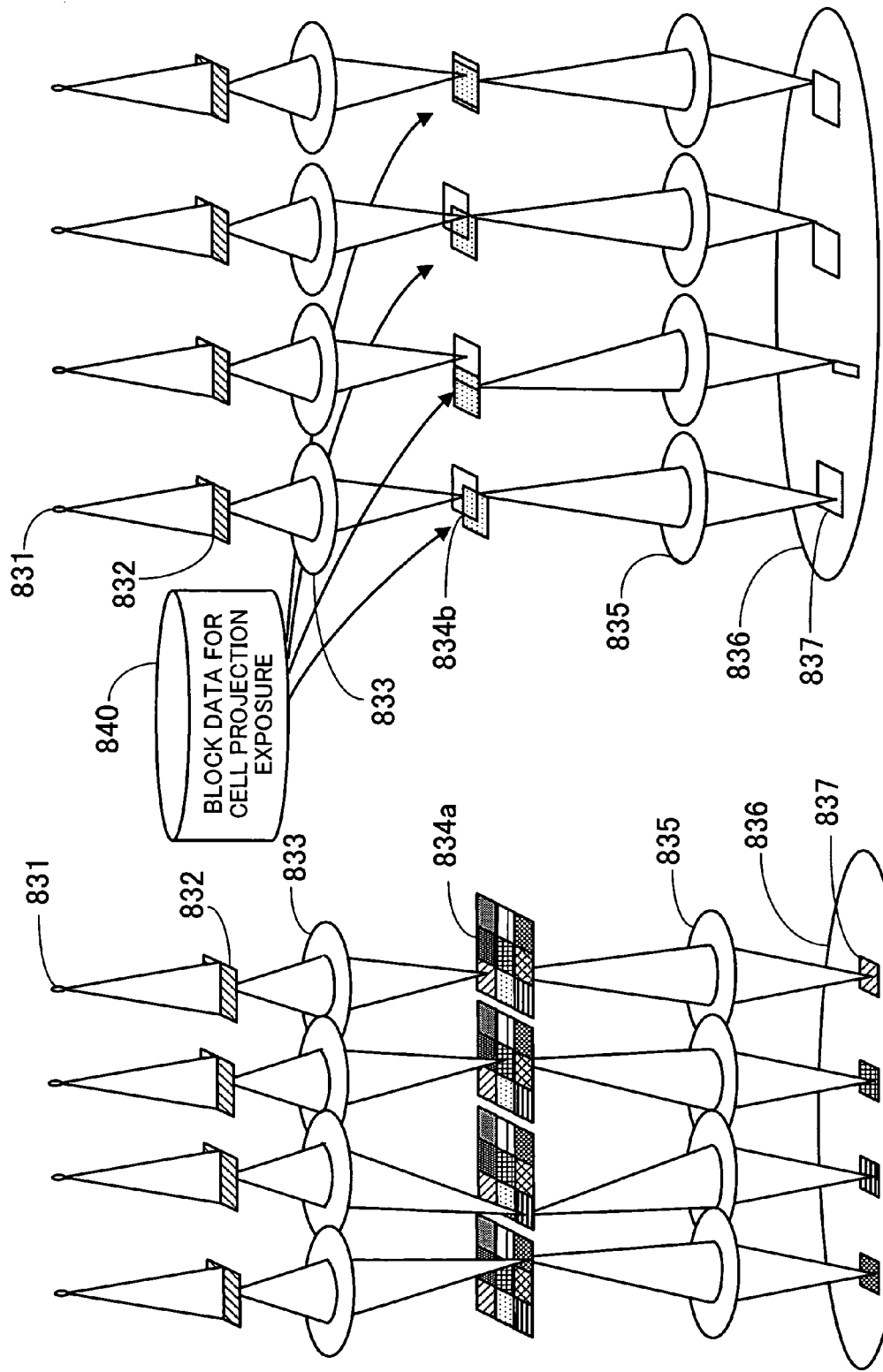

METHOD AND APPARATUS FOR GENERATING EXPOSURE DATA

CROSS-REFERENCE TO RELATED APPLICATIONS

This application is based upon and claims the benefits of priority from the prior Japanese Patent Application No. 2004-165901, filed on Jun. 3, 2004, the entire contents of which are incorporated herein by reference.

BACKGROUND OF THE INVENTION (1) Field of the Invention

This invention relates to a method and apparatus for generating exposure data and, more particularly, to a method and apparatus for generating exposure data for transferring a pattern by exposing a semiconductor substrate or a reticle by the use of a plurality of charged particle beams.

(2) Description of the Related Art

The process for fabricating semiconductor devices, such as large scale integrated circuits (LSIs), includes a lithography process for transferring a circuit pattern (pattern) onto a semiconductor substrate (wafer) by exposure.

In recent years semiconductor devices have become minuter. As a result, higher resolution is needed in the lithography process, so techniques using a charged particle beam, such as an electron beam or an ion beam, are examined and put to practical use. For example, the beam diameter of an electron beam can be narrowed down to several nanometers. Therefore, minute patterns with line width narrower than or equal to 100 nm can be formed.

In the early lithography processes using an electron beam, writing was performed by scanning a narrowed electron beam. That is to say, what is called a single stroke writing method was adopted. With this method, however, it takes a long time to form a large pattern, so exposure throughput is low. Therefore, this method was used only for making a reticle for optical exposure, fabricating a semiconductor device having a minute pattern which is difficult to form by optical exposure on an experimental basis, or the like. As a result, the following lithography techniques are developed in succession.

FIGS. 11A and 11B are views showing examples of a lithography technique using an electron beam. FIG. 11A is a view showing a lithography technique called a variable rectangular exposure method. FIG. 11B is a view showing a lithography technique called a cell projection exposure method.

In the variable rectangular exposure method shown in FIG. 11A, an electron beam emitted from an electron gun 800 is shaped into a variable rectangle by a first aperture 801 having an opening 801a. In addition, the electron beam is shaped into a rectangle or a triangle of a desired size by a mask 802 having an opening 802a. A resist with which a wafer (or reticle) 803 is coated is irradiated with the shaped electron beam to form a pattern 804. With this method, however, the pattern to be formed is divided into small blocks and one shot of exposure is performed for each small block. Accordingly, exposure throughput is low. This problem can be solved by using the cell projection exposure method shown in FIG. 11B.

In the cell projection exposure method, a mask 805 on which a plurality of opening patterns 805a are formed is used. In many semiconductor devices, the same pattern or the same pattern group is used repeatedly. An opening having the shape of such a pattern or pattern group repeatedly used is used as each opening pattern 805a. As a result, a unit pattern 806 can be formed in block on the wafer (or reticle) 803 with a single shot. This enhances exposure throughput. The variable rectangular exposure method shown in FIG. 11A is used for forming a pattern which is not used repeatedly.

In order to obtain high throughput in the cell projection exposure method, it is necessary to extract a pattern or a pattern group used many times, that is to say, data highly effective in performing cell projection exposure from layout data for exposure and to generate exposure data in which the extracted data is used as blocks for cell projection exposure. Accordingly, a technique for extracting blocks for cell projection exposure from layout data for exposure including a plurality of patterns so as to minimize the total number of shots of an electron beam for exposure data for one layer by which a pattern is transferred onto a wafer is disclosed (see, for example, Japanese Unexamined Patent Publication No. Hei5-182899).

FIG. 12 is a sectional view showing the rough structure of a conventional electron beam exposure apparatus.

In an electron beam exposure apparatus 810 shown in FIG. 12, an electron beam emitted from an electron gun 811 is shaped and deflected by an electron lens 812, an aperture 813, an electron lens 814, and a deflector 815 and is applied to a predetermined position on a mask 817 via an electron lens 816. The mask 817 is held by a mask stage 818. In addition, the electron beam applied to the predetermined position on the mask 817 having an opening in the shape of a pattern is deflected by a deflector 819 and an electron lens 820 and is applied to a predetermined position on a wafer (or reticle) 821. As a result, the pattern is formed.

Meanwhile, a multi-beam exposure apparatus in which a plurality of electron beams are applied to one wafer or reticle at one time is proposed. A combination of this multi-beam exposure apparatus and the cell projection exposure method is expected to significantly enhance exposure throughput.

FIGS. 13A and 13B are schematic views of multi-beam exposure methods. FIG. 13A is a schematic view of a multi-beam exposure method using a mask on which blocks for cell projection exposure are formed. FIG. 13B is a schematic view of a multi-beam exposure method in which blocks for cell projection exposure are represented by electronic data.

With the multi-beam exposure method shown in FIG. 13A, electron beams emitted from a plurality of electron guns 831 are shaped and deflected by apertures 832 and deflecting sections (each including the electron lens, the deflector, and the like shown in FIG. 12) 833 and are applied simultaneously to opening patterns, being blocks for cell projection exposure, at predetermined positions on masks 834a. In addition, the electron beams are deflected by deflecting sections 835 and are applied to predetermined positions on a wafer (or reticle) 836 to simultaneously form a plurality of patterns 837.

Meanwhile, with the multi-beam exposure method shown in FIG. 13B, a physical mask is not used. In this case, blocks for cell projection exposure are represented by electronic data stored in a database 840 and patterns 837 are formed by controlling the opening and closing of slits 834b.

It is necessary to extract a pattern or a pattern group used many times, that is to say, data highly effective in performing cell projection exposure from layout data for exposure and to generate exposure data in which the extracted data is used as blocks for cell projection exposure. This applies both to a case where opening patterns, being blocks for cell projection exposure, are formed on a mask and to a case where blocks for cell projection exposure are held as electronic data.

Moreover, with the multi-beam exposure methods, a plurality of charged particle beams are applied simultaneously to corresponding areas on a wafer or a reticle. Accordingly, exposure throughput depends on time taken to perform exposure in one of these areas (unit areas) where the number of shots is the greatest.

SUMMARY OF THE INVENTION

In the present invention, an exposure data generation method for generating exposure data for transferring a pattern by exposing a semiconductor substrate or a reticle by the use of a plurality of charged particle beams is provided. This exposure data generation method comprises the steps of extracting layout data including a plurality of patterns as a plurality of blocks for cell projection exposure; dividing the layout data among unit areas corresponding to a region on the semiconductor substrate or the reticle to which the plurality of charged particle beams are applied simultaneously; calculating the number of shots of the plurality of charged particle beams in each of the unit areas on the basis of the plurality of blocks for cell projection exposure extracted; and selecting, in the case of the number of types of the plurality of blocks for cell projection exposure extracted being greater than a predetermined permissible number, a block for cell projection exposure that is the least effective in performing cell projection exposure from among a plurality of blocks for cell projection exposure included in a unit area where the number of shots calculated is the smallest, and deleting the block for cell projection exposure from all of the unit areas, the calculating of the number of shots in each of the unit areas and the deleting of the block for cell projection exposure being repeated until the number of the types becomes equal to the permissible number.

In addition, in the present invention an exposure data generation apparatus for generating exposure data for transferring a pattern by exposing a semiconductor substrate or a reticle by the use of a plurality of charged particle beams is provided. This exposure data generation apparatus comprises an extraction section for extracting layout data including a plurality of patterns as a plurality of blocks for cell projection exposure; a unit area division section for dividing the layout data among unit areas corresponding to a region on the semiconductor substrate or the reticle to which the plurality of charged particle beams are applied simultaneously; a shot number calculation section for calculating the number of shots of the plurality of charged particle beams in each of the unit areas on the basis of the plurality of blocks for cell projection exposure extracted; and a cell projection exposure block number control section for selecting, in the case of the number of types of the plurality of blocks for cell projection exposure extracted being greater than a predetermined permissible number, a block for cell projection exposure that is the least effective in performing cell projection exposure from among a plurality of blocks for cell projection exposure included in a unit area where the number of shots calculated is the smallest, and for deleting the block for cell projection exposure from all of the unit areas, the calculating of the number of shots in each of the unit areas and the deleting of the block for cell projection exposure being repeated by the shot number calculation section and the cell projection exposure block number control section, respectively, until the number of the types becomes equal to the permissible number.

The above and other features and advantages of the present invention will become apparent from the following description when taken in conjunction with the accompanying drawings which illustrate preferred embodiments of the present invention by way of example.

BRIEF DESCRIPTION OF THE DRAWINGS

FIG. 3 shows an example of a shot number management table.

FIG. 4 shows an example of a cell projection block management table.

FIGS. 13A and 13B are schematic views of multi-beam exposure methods, FIG. 13A being a schematic view of a multi-beam exposure method using a mask on which blocks for cell projection exposure are formed, FIG. 13B being a schematic view of a multi-beam exposure method in which blocks for cell projection exposure are represented by electronic data.

DESCRIPTION OF THE PREFERRED EMBODIMENTS

As described in "Description of the Related Art," if exposure data for exposure with a plurality of charged particle beams is generated by the conventional exposure data generation method, the total number of shots can be reduced. However, there is great variation in the number of shots among unit areas, so high throughput cannot be gotten.

The present invention was made in order to solve this problem. An object of the present invention is to provide a method and apparatus for generating exposure data which enables high throughput exposure by controlling variation in the number of shots among unit areas to which a plurality of charged particle beams are applied simultaneously.

Embodiments of the present invention will now be described in detail with reference to the drawings.

Figure 1:
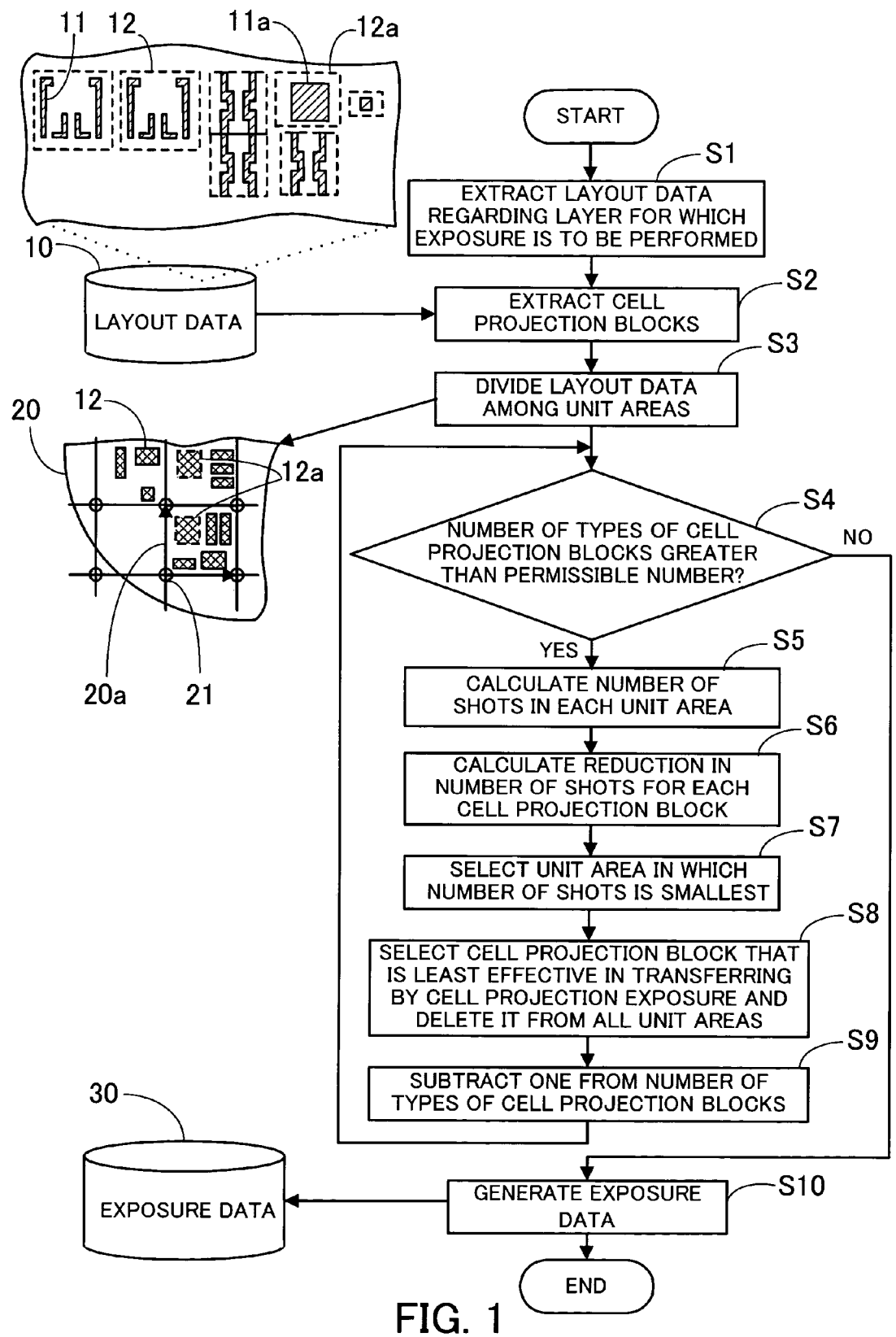
FIG. 1 is a flow chart showing the flow of an exposure data generation method according to a first embodiment of the present invention.

FIG. 1 is a flow chart showing the flow of an exposure data generation method according to a first embodiment of the present invention.

To generate exposure data, layout data 10 for a layer for which exposure is to be performed is extracted first (step S1). The layout data 10 includes a plurality of patterns 11 to be transferred by exposure.

Then the layout data 10 including the plurality of patterns 11 is extracted as a plurality of blocks 12 for cell projection exposure (cell projection blocks 12) (step S2). In this case, patterns or pattern groups are extracted in descending order of repetitiveness (in descending order of frequency of use for the layer) as the cell projection blocks 12 so that all of the plurality of patterns 11 included in the layout data 10 will be represented. However, it is unnecessary to include a pattern 11a (contact hole or the like) corresponding to one shot in variable rectangular exposure in the cell projection blocks 12.

Then the layout data 10 extracted as the cell projection blocks 12 is divided among unit areas 20a corresponding to a region on a wafer or a reticle (hereinafter a wafer will be used) 20 to which a plurality of charged particle beams (hereinafter a plurality of electron beams will be used) are applied simultaneously (step S3). For example, as shown in FIG. 1, exposure by each electron beam is begun at an exposure start position 21 and is performed in each unit area 20a. Each unit area 20a is defined by a region on the wafer 20 to which an electron beam is applied by the deflecting section 835 used in the multi-beam exposure method shown in FIG. 13A or 13B or by the distance between two adjacent electron beams. A margin area is set for each unit area 20a to prevent two electron beams from being applied to the same chip.

Figure 2:
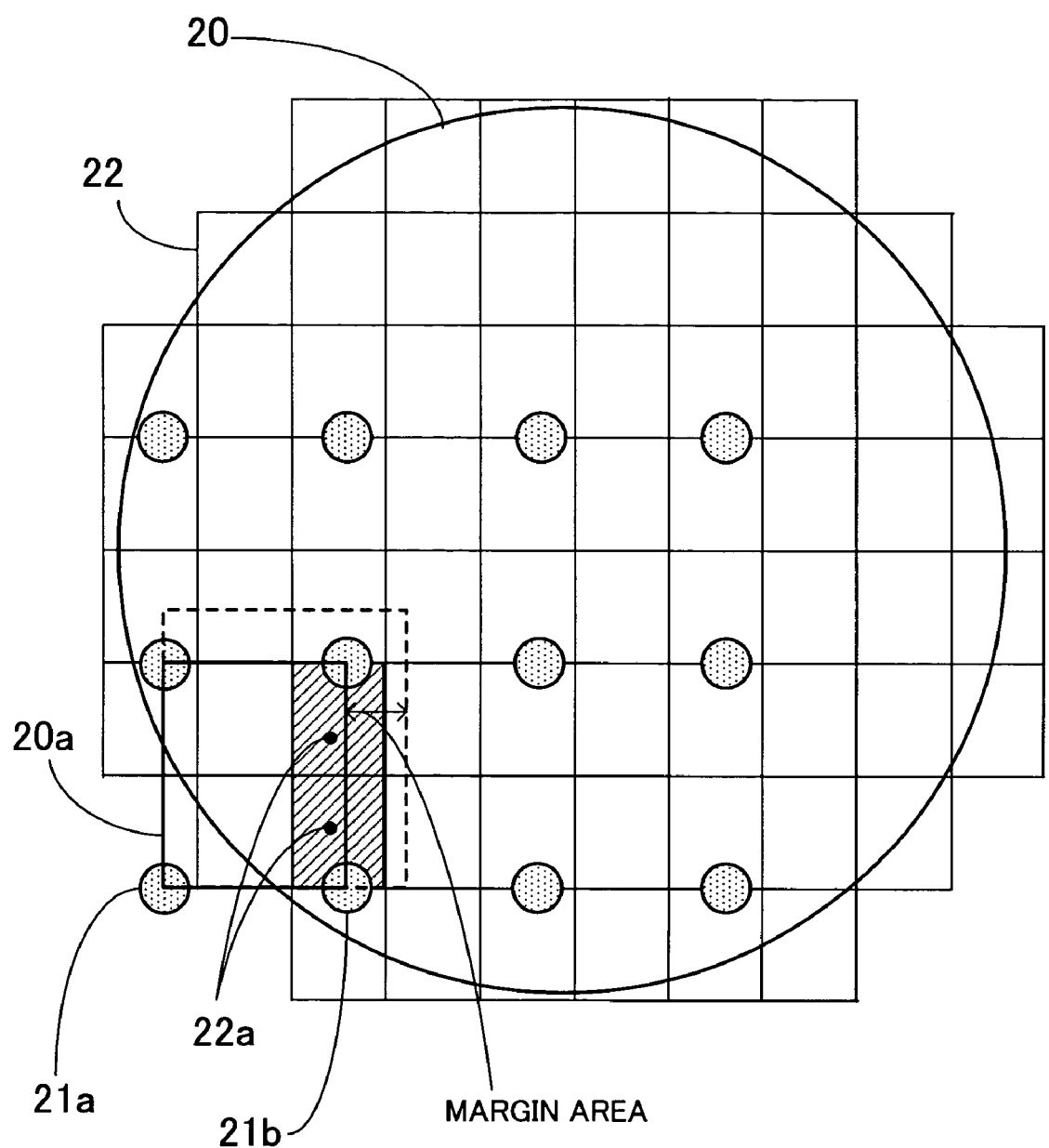
FIG. 2 is a view for describing a margin area.

FIG. 2 is a view for describing a margin area.

As shown in FIG. 2, a plurality of chips 22 are formed on the wafer 20. For example, a chip 22a includes two areas. An electron beam by which exposure is begun at an exposure start position 21a is applied to one area and an electron beam by which exposure is begun at an exposure start position 21b is applied to the other area. As a result, two electron beams are applied to the same chip 22a. To avert such a situation, a margin area is set for each unit area 20a. By doing so, one electron beam is applied to one chip 22. The size of this margin area is larger than that of the cell projection blocks 12 extracted. Therefore, even if the cell projection blocks 12 are divided among the unit areas 20a after being extracted, there is no need to process the cell projection blocks 12.

After the cell projection blocks 12 are divided among the unit areas 20a, the number of types of the cell projection blocks 12 extracted is compared with a permissible number (step S4). With the multi-beam exposure method using a mask shown in FIG. 13A, the permissible number corresponds to the number of cell projection blocks which can be formed on the mask 834a. With the multi-beam exposure method shown in FIG. 13B in which cell projection blocks are held as data, the permissible number depends on the capacity of a storage buffer used in the multi-beam exposure method. If the number of the types of the cell projection blocks 12 is smaller than or equal to the permissible number, then exposure data 30 is generated on the basis of the cell projection blocks 12 (step S10).

On the other hand, if the number of the types of the cell projection blocks 12 is greater than the permissible number, then the number of shots in each unit area 20a is calculated (step S5). The number of shots calculated is stored in a shot number management table described below.

FIG. 3 shows an example of a shot number management table.

In this example, the cell projection blocks 12 are divided among forty-five (=5×9) unit areas. As shown in FIG. 3, the number of shots in each unit area calculated is stored. If the unit areas 20a include only the cell projection blocks 12, then the number of shots is equal to that of the cell projection blocks 12.

Then a reduction in the number of shots, being the difference between the total number of exposure shots in variable rectangular exposure for transferring a block identical to each of the cell projection blocks 12 on the wafer 20 and the total number of exposure shots in cell projection exposure performed on the wafer 20 by using the cell projection block 12, is calculated (step S6). The calculated reduction in the number of shots is stored in a cell projection block management table described below.

FIG. 4 shows an example of a cell projection block management table.

As shown in FIG. 4, for each cell projection block 12 a cell projection block number, a deletion flag (described later), a reduction in the number of shots, and a use unit area position number (which indicates the position of a unit area 20a where the cell projection block is used) are managed. In this example, a use unit area position number indicates the position of one of the forty-five unit areas 20a which are shown in FIG. 3 and which are arranged in nine rows and five columns like a matrix. For example, (2, 3) indicates the unit area 20a located in the third row and the fourth column.

It is assumed that a reduction in the number of shots for a cell projection block 12 is large. This means that the cell projection block 12 is used on the wafer 20 many times (that is to say, the cell projection block 12 repeats many times). Alternatively, this means that the cell projection block 12 includes, for example, a complex pattern and that the transferring of the cell projection block 12 by variable rectangular exposure involves a vast number of shots. Such a cell projection block 12 for which a reduction in the number of shots is large is highly effective in transferring by cell projection exposure or is highly effective in reducing the number of shots. Conversely, a cell projection block 12 for which a reduction in the number of shots is small is not very effective in transferring by cell projection exposure or is not very effective in reducing the number of shots.

The number of shots calculated for each unit area 20a is referred to and a unit area 20a in which the number of shots is the smallest is selected (step S7). For example, in the shot number management table shown in FIG. 3, a unit area (Fmin) the use unit area position number of which is (4, 8) is selected.

Then a cell projection block 12a that is the least effective in transferring by cell projection exposure is selected from among cell projection blocks 12 used in the unit area 20a in which the number of shots is the smallest, and is deleted from all of the unit areas 20a (step S8). One is subtracted from the number of the types of the cell projection blocks (step S9). For example, it is assumed that the unit area (Fmin) the use unit area position number of which is (4, 8) and in which the number of shots is the smallest is selected in the shot number management table shown in FIG. 3. As shown in FIG. 4, two cell projection blocks are used in this unit area. A cell projection block number and a reduction in the number of shots for one cell projection block are 2 and 209381 respectively. A cell projection block number and a reduction in the number of shots for the other cell projection block are 5 and 233576 respectively. In this case, one of the two cell projection blocks for which a reduction in the number of shots is smaller, that is to say, the cell projection block a reduction in the number of shots for which is 209381 is deleted. A deletion flag corresponding to the cell projection block number "2" is set to 1. As a result, this cell projection block is also deleted from unit areas 20a indicated by the use unit area position numbers (0, 8), (1, 2), (1, 3), (1, 6), and (2, 1). A cell projection block to be deleted is selected from cell projection blocks deletion flags for which are 0.

After that step S4 is performed again. Until the number of the types of the cell projection blocks 12 becomes equal to the permissible number, steps S5 through S9 are repeated.

When the cell projection block 12a for which a reduction in the number of shots is the smallest is deleted from the unit area 20a in which the number of shots is the smallest, the cell projection block 12a is transferred by variable rectangular exposure. Therefore, the number of shots in the unit area 20a in which the number of shots is the smallest and the number of shots calculated for unit are as 20a in which the cell projection block 12a is used increase. By repeating steps S5 through S9, the number of shots in each unit area 20a becomes equal.

As stated above, with the exposure data generation method according to the first embodiment of the present invention, if the number of the types of the cell projection blocks 12 extracted from the layout data 10 is greater than the permissible number, the cell projection block 12a that is the least effective in transferring by cell projection exposure is deleted from the cell projection blocks 12 used in the unit area 20a in which the number of shots is the smallest. This process is repeated until the number of the types of the cell projection blocks 12 extracted from the layout data 10 becomes equal to the permissible number. Accordingly, the number of shots in each of the unit areas 20a on the wafer 20 to which the plurality of electron beams are simultaneously applied can be made equal and the exposure throughput of a multi-beam exposure apparatus can be enhanced.

In addition, patterns or groups of patterns are extracted in descending order of repetitiveness (in descending order of frequency of use for the layer for which exposure is to be performed) as the cell projection blocks 12 so that all of the plurality of patterns 11 included in the layout data 10 will be represented. Therefore, only the cell projection blocks 12 highly effective in transferring by cell projection exposure can be extracted.

An exposure data generation method according to a second embodiment of the present invention will now be described.

Figure 5:
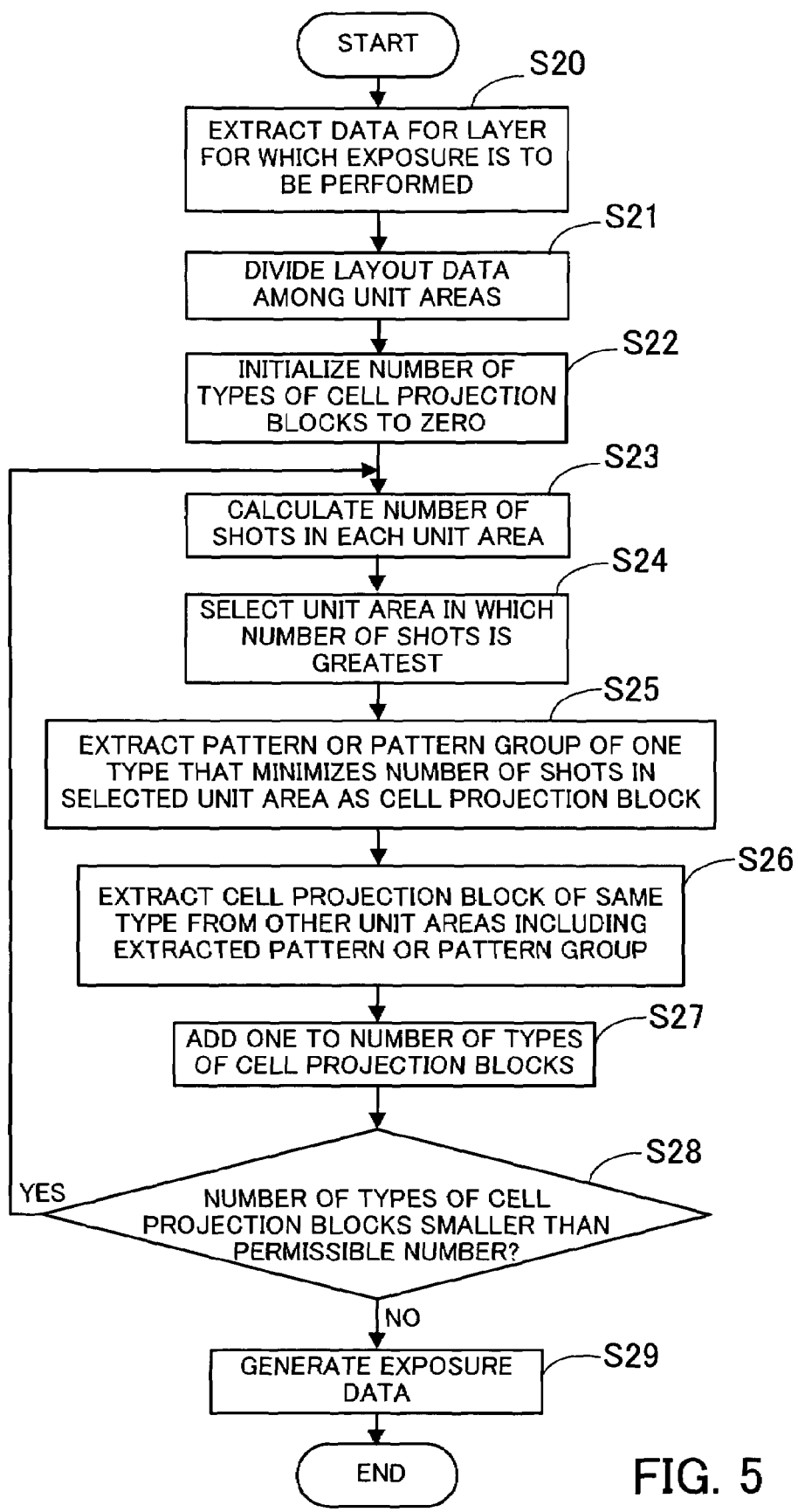
FIG. 5 is a flow chart showing the flow of an exposure data generation method according to a second embodiment of the present invention.

FIG. 5 is a flow chart showing the flow of an exposure data generation method according to a second embodiment of the present invention.

To generate exposure data, layout data for a layer for which exposure is to be performed is extracted first (step S20).

Then the layout data is divided among unit areas on a wafer to which a plurality of electron beams are applied simultaneously (step S21). This step is the same as step S3 in the first embodiment shown in FIG. 1.

The number of the types of cell projection blocks is initialized to zero (step S22) and the number of shots in each unit area is calculated (step S23). The number of the types of cell projection blocks for each unit area is zero at first, so the number of shots necessary for transferring all of patterns on each unit area by variable rectangular exposure is calculated. The number of shots calculated is stored in a shot number management table like that shown in FIG. 3.

A unit area (Fmax) in which the number of shots is the greatest is selected from the shot number management table like that shown in FIG. 3 (step S24). A pattern or a pattern group of one type that minimizes the number of shots in the unit area (Fmax) is extracted from a plurality of patterns included in the unit area (Fmax) as a cell projection block with the repetitiveness of the plurality of patterns included in the unit area (Fmax) taken into consideration (step S25). Furthermore, a cell projection block of the same type is extracted from another unit area including the extracted pattern or pattern group (step S26). Then one is added to the number of the types of the cell projection blocks (step S27). At this time a reduction in the number of shots and the use unit area position numbers of the unit areas from which the cell projection block is extracted are updated in a cell projection block management table like that shown in FIG. 4.

After that the number of the types of the cell projection blocks is compared with a permissible number like that described above (step S28). Steps S23 through S27 are repeated until the number of the types of the cell projection blocks becomes equal to the permissible number. When the number of the types of the cell projection blocks becomes equal to the permissible number, exposure data is generated on the basis of the extracted cell projection blocks (step S29).

As stated above, with the exposure data generation method according to the second embodiment of the present invention, a cell projection block is extracted from a unit area in which the number of shots is the greatest so that the number of shots in the unit area will be minimized. Therefore, the number of shots can be reduced and the number of shots in each unit area can be made equal. This enhances the exposure throughput of a multi-beam exposure apparatus.

An exposure data generation method according to a third embodiment of the present invention will now be described.

Figure 6:
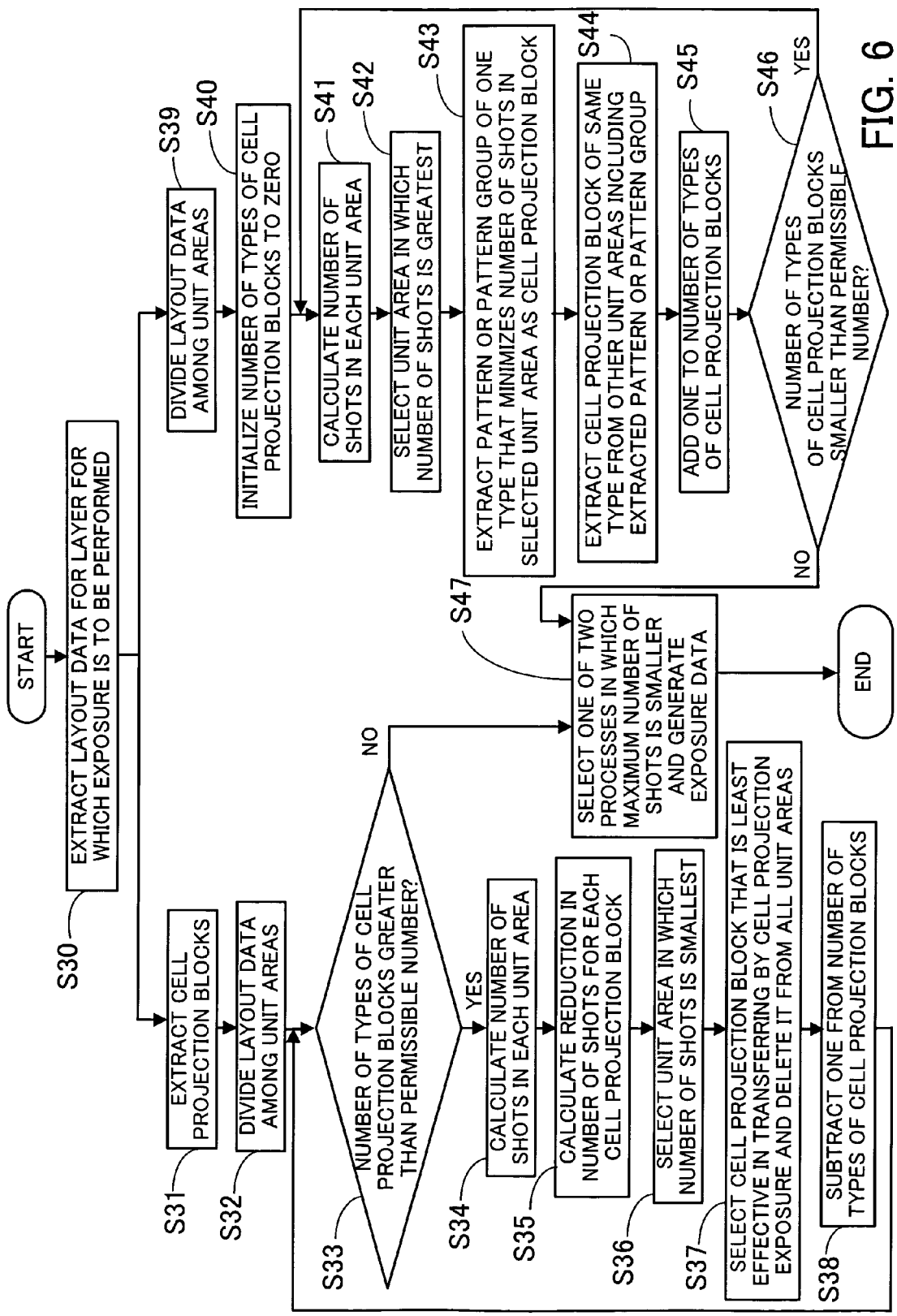
FIG. 6 is a flow chart showing the flow of an exposure data generation method according to a third embodiment of the present invention.

FIG. 6 is a flow chart showing the flow of an exposure data generation method according to a third embodiment of the present invention.

The exposure data generation method according to the third embodiment of the present invention is a combination of the exposure data generation methods according to the first and second embodiments. Layout data for a layer for which exposure is to be performed is extracted first (step S30). Then a process including steps S31 through S38 corresponding to steps S2 through S9, respectively, in the exposure data generation method according to the first embodiment and a process including steps S39 through S46 corresponding to steps S21 through S28, respectively, in the exposure data generation method according to the second embodiment are performed in parallel. With the exposure data generation method according to the third embodiment of the present invention, when the number of the types of the cell projection blocks becomes equal to the permissible number in each process, a shot number management table like that shown in FIG. 3 is referred to, the maximum number of shots in one process is compared with the maximum number of shots in the other process, and exposure data is generated on the basis of the cell projection blocks in one of the two processes in which the maximum number of shots is smaller (step S47). This further enhances exposure throughput.

An outline of an exposure data generation apparatus according to the present invention will now be given.

Figure 7:
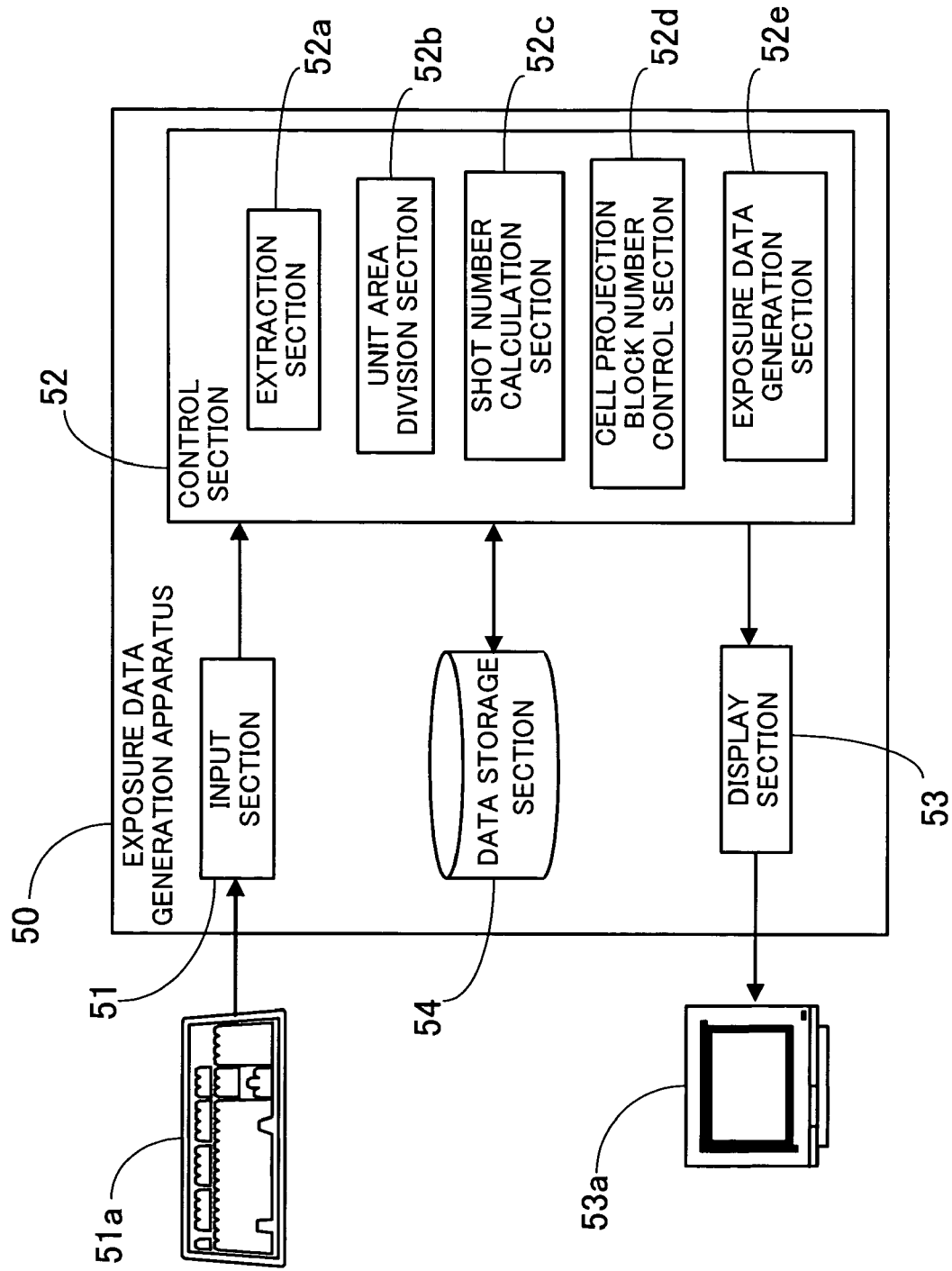
FIG. 7 is a functional block diagram of an exposure data generation apparatus according to an embodiment of the present invention.

FIG. 7 is a functional block diagram of an exposure data generation apparatus according to an embodiment of the present invention.

An exposure data generation apparatus 50 is, for example, a computer and comprises an input section 51 for accepting input given by a user with a keyboard 51a or the like, a control section 52 for controlling each section of the exposure data generation apparatus 50, a display section 53 for displaying, for example, a processing screen on a display 53a or the like at the time of generating exposure data, and a data storage section 54 for storing the above-mentioned layout data, shot number management tables, cell projection block management tables, and generated exposure data.

Input is provided to the input section 51 in order to designate a unit area defined by a region on a wafer to which an electron beam is applied by the deflecting section 835 used in the multi-beam exposure method shown in FIG. 13A or 13B or by the distance between two adjacent electron beams, to designate a margin area for a unit area for preventing two electron beams from being applied to the same chip, or to designate the permissible number of cell projection blocks which can be formed on a mask.

The control section 52 is, for example, a central processing unit (CPU) and performs the functions of the functional blocks of an extraction section 52a, a unit area division section 52b, a shot number calculation section 52c, a cell projection block number control section 52d, and an exposure data generation section 52e.

The extraction section 52a performs step S2 in the exposure data generation method according to the first embodiment and steps S25 and S26 in the exposure data generation method according to the second embodiment in which a cell projection block is extracted from the layout data.

The unit area division section 52b performs step S3 in the exposure data generation method according to the first embodiment and step S21 in the exposure data generation method according to the second embodiment in which the layout data is divided among the unit areas.

The shot number calculation section 52c performs step S5 in the exposure data generation method according to the first embodiment and step S23 in the exposure data generation method according to the second embodiment in which the number of shots in each unit area is calculated.

The cell projection block number control section 52d performs step S8 in the exposure data generation method according to the first embodiment in which a cell projection block being the least effective in transferring by cell projection exposure is selected from among the cell projection blocks used in the unit area in which the number of shots is the smallest and in which the selected cell projection block is deleted from all of the unit areas.

The exposure data generation section 52e performs step S10 in the exposure data generation method according to the first embodiment and step S29 in the exposure data generation method according to the second embodiment in which exposure data is generated on the basis of the extracted cell projection blocks.

The above-mentioned exposure data generation method according to the third embodiment of the present invention can be fulfilled by the exposure data generation apparatus 50 having such a structure. When the number of the types of the cell projection blocks becomes equal to the permissible number in each of the processes shown in the exposure data generation methods according to the first and second embodiments, the control section 52 refers to a shot number management table like that shown in FIG. 3, compares the maximum number of shots in one process with the maximum number of shots in the other process, and generates exposure data on the basis of the cell projection blocks in one of the two processes in which the maximum number of shots is smaller.

The exposure data generation apparatus 50 may be a parallel computer having a plurality of processors or a cluster type computer. In this case, exposure data can be generated at high speed by performing the above-mentioned processes (such as calculating the number of shots) in each unit area by different processors. Furthermore, in the exposure data generation method according to the third embodiment, exposure data can be generated at high speed by performing the process including steps S31 through S38 and the process including steps S39 through S46 with two different processors.

Finally distribution of the number of exposure shots applied for transferring layout data onto a wafer in cases where only variable rectangular exposure is performed by using a single beam, where cell projection exposure is performed by using a single beam, and where exposure is performed by using multiple beams and exposure data obtained by the present invention will be shown.

Figure 8:
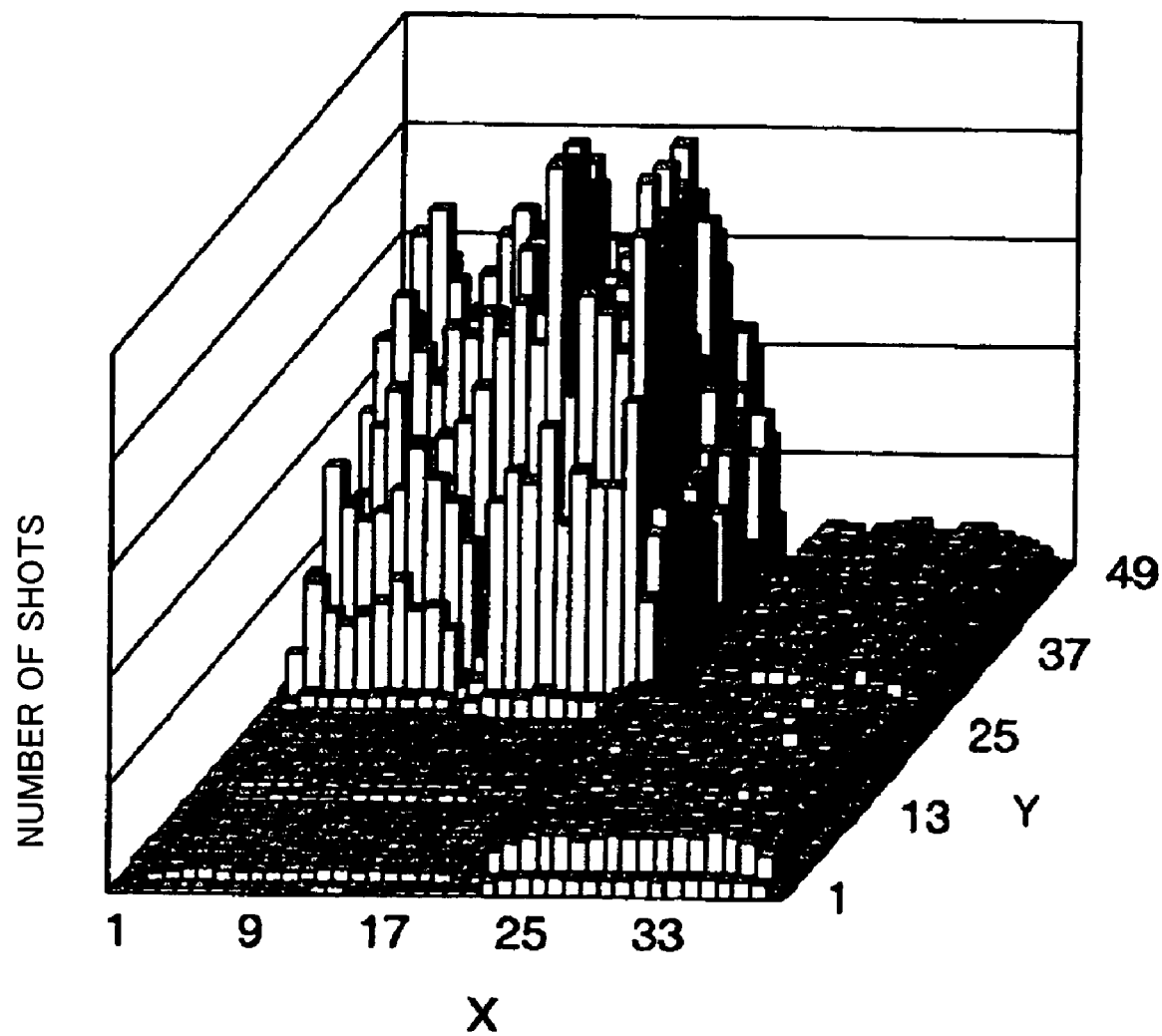
FIG. 8 shows distribution of the number of shots applied in a case where only variable rectangular exposure is performed by using a single beam.

FIG. 8 shows distribution of the number of shots applied in a case where only variable rectangular exposure is performed by using a single beam.

Figure 9:
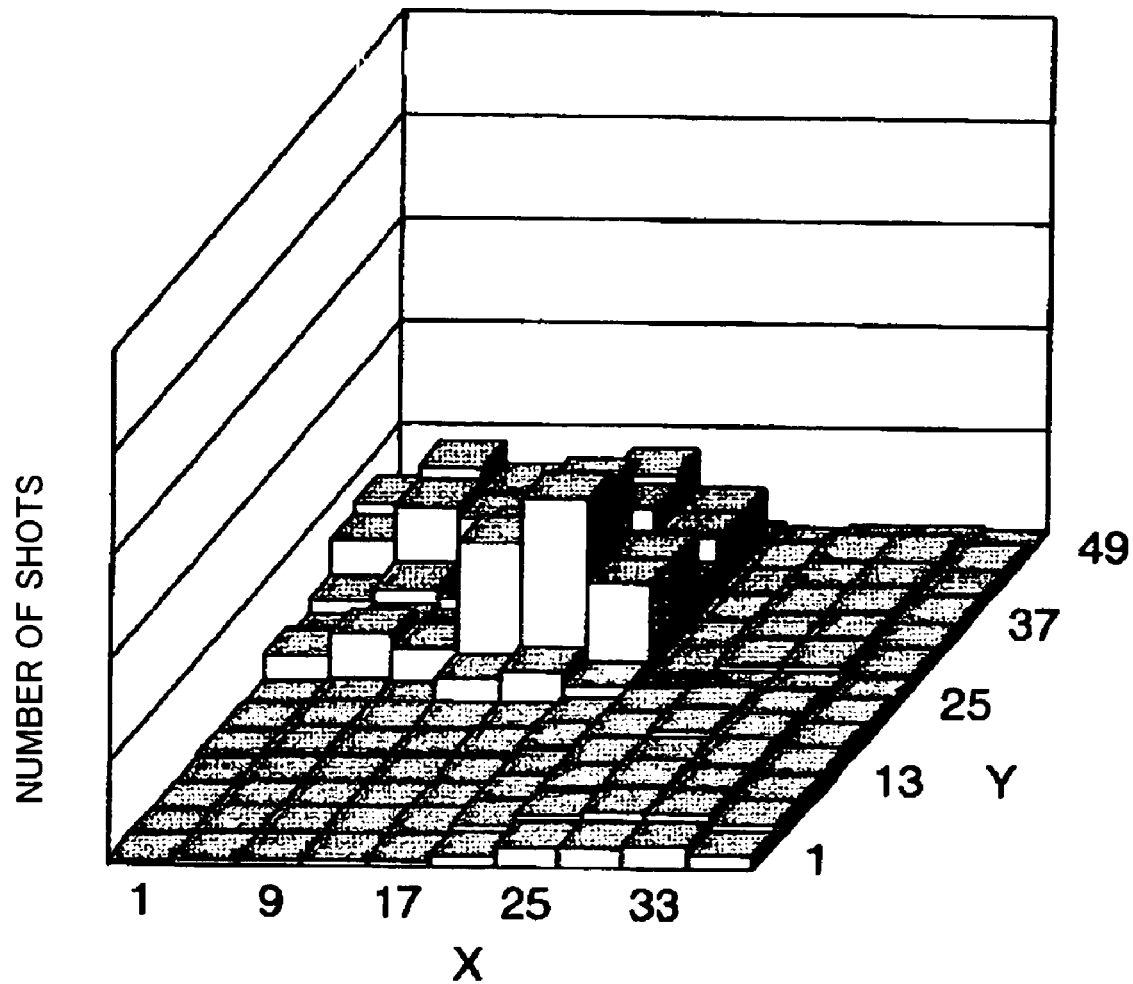
FIG. 9 shows distribution of the number of shots applied in a case where cell projection exposure is performed by using a single beam.

FIG. 9 shows distribution of the number of shots applied in a case where cell projection exposure is performed by using a single beam.

Figure 10:
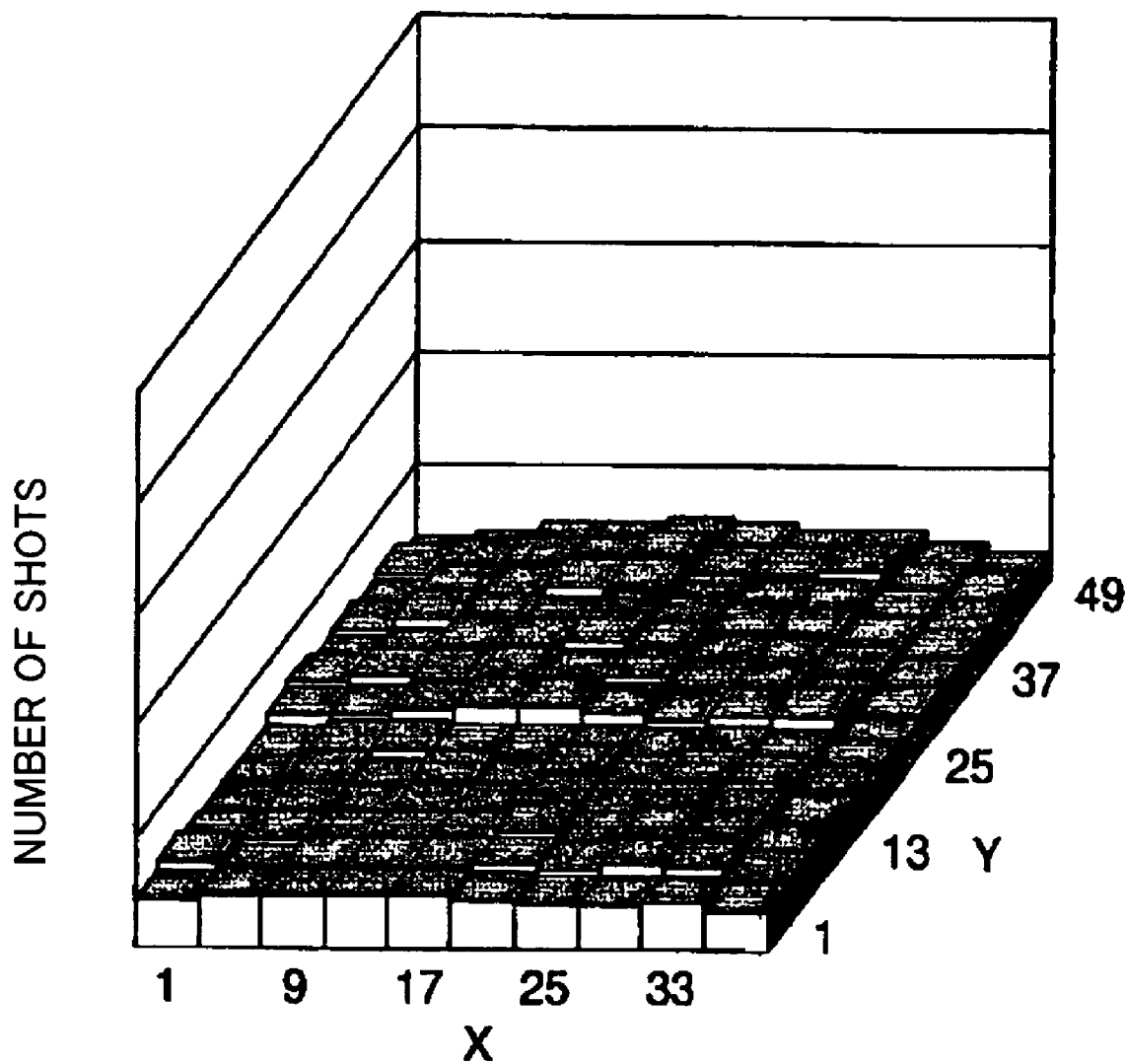
FIG. 10 shows distribution of the number of shots applied in each unit area by using exposure data for a multi-beam exposure method generated by the present invention.
Figure 11B:
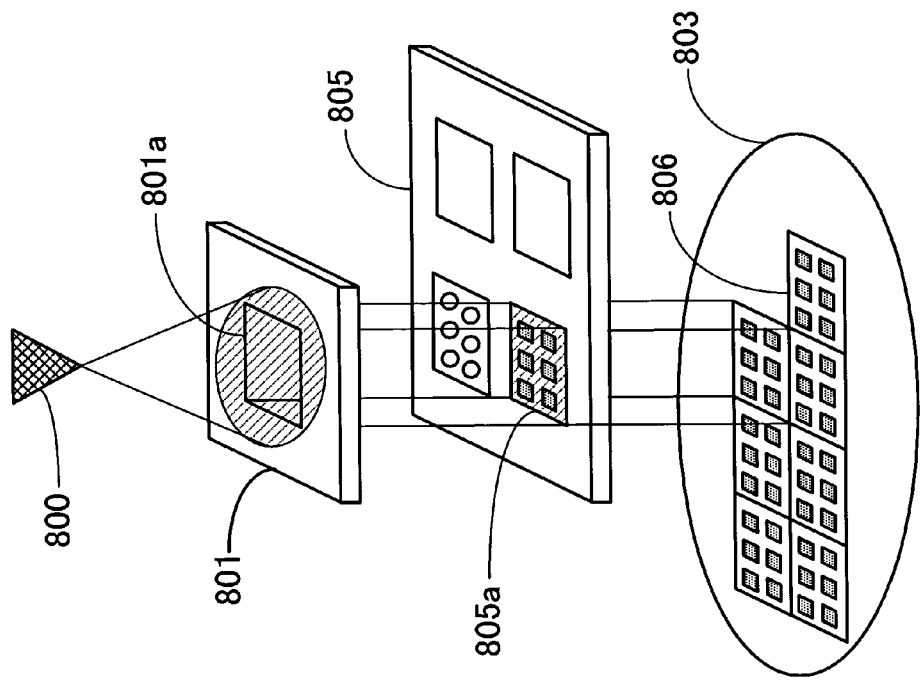
FIGS. 11A and 11B are views showing examples of a lithography technique using an electron beam, FIG. 11A being a view showing a lithography technique called a variable rectangular exposure method, FIG. 11B being a view showing a lithography technique called a cell projection exposure method.
Figure 11A:
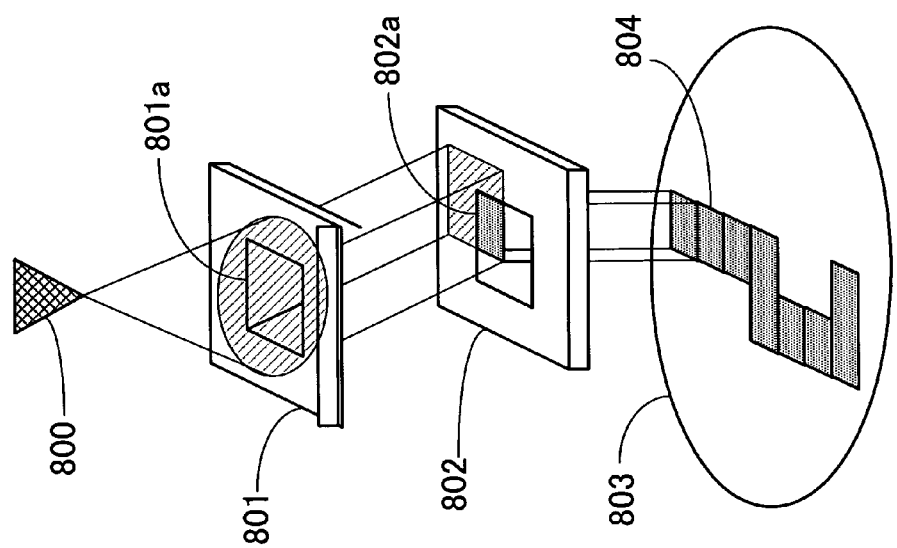
Figure 12:
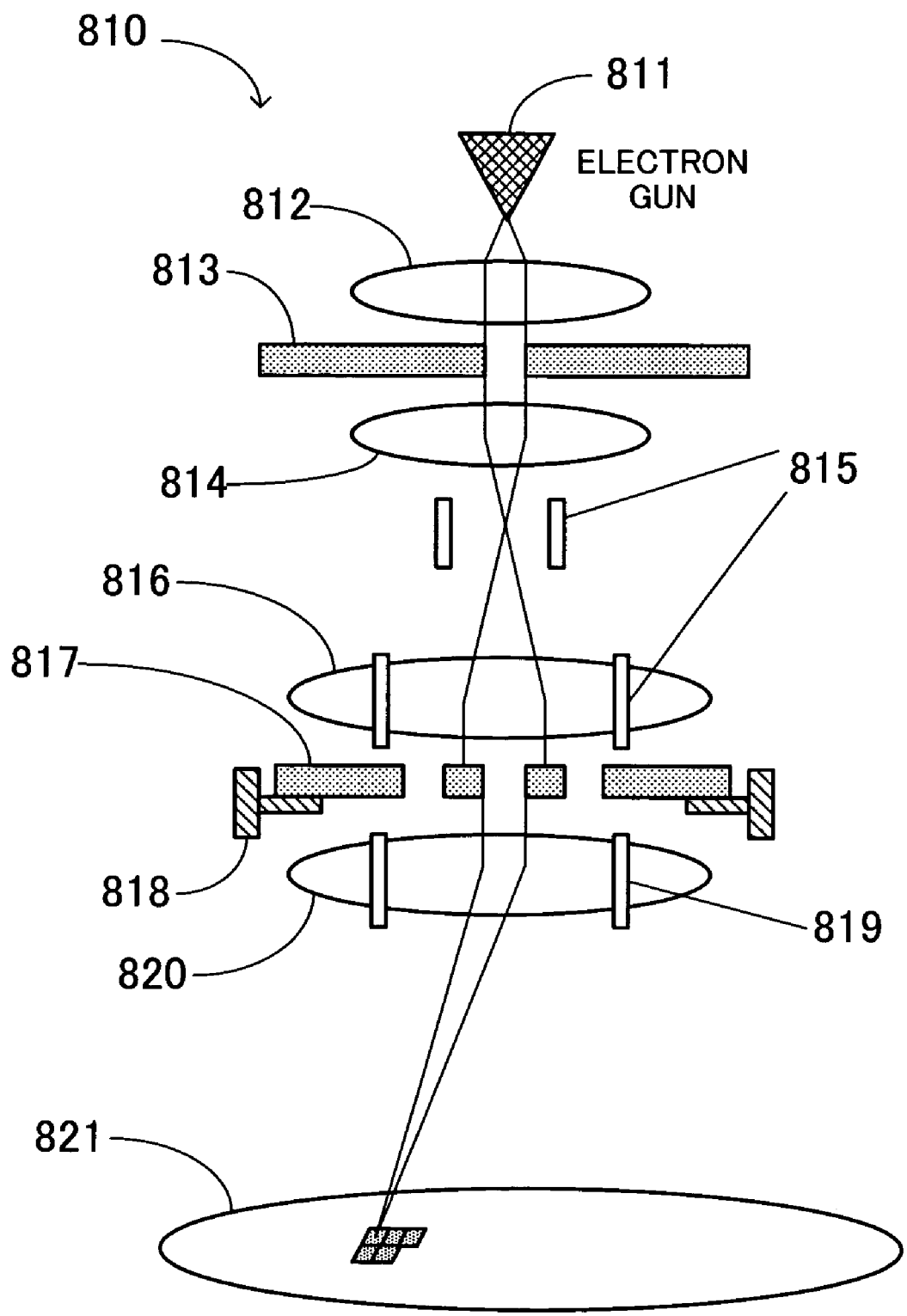
FIG. 12 is a sectional view showing the rough structure of a conventional electron beam exposure apparatus.

FIG. 10 shows distribution of the number of shots applied in each unit area by using exposure data for a multi-beam exposure method generated by the present invention.

As shown in FIG. 8, if variable rectangular exposure is performed by using a single beam, there are variations in the number of shots in individual areas and the number of shots increases. As shown is FIG. 9, if cell projection exposure is performed, the number of shots decreases. However, there are variations in the number of shots in individual areas. If multi-beam exposure is performed, throughput cannot be enhanced. As described above, the number of shots in each unit area can be made equal by using exposure data generated by the present invention. As a result, the distribution of the number of shots shown in FIG. 10 is obtained. This enhances exposure throughput in multi-beam exposure.

The above descriptions were given with a case where a wafer is exposed as an example. The same applies to a case where a reticle is exposed. In addition, an electron beam was used as a charged particle beam. However, the present invention is also applicable to a case where an ion beam or the like is used.

Furthermore, the above descriptions were given with a case where exposure and transfer are performed for fabricating semiconductor devices as an example. However, the present invention is also applicable to a case where storage units or units using a microelectromechanical system (MEMS) are fabricated.

The present invention is applied in a lithography process for transferring a pattern onto a wafer on which semiconductor devices, such as LSIs, are to be formed by exposure.

In the present invention, exposure data that enhances exposure throughput by making the number of shots in each of unit areas on a semiconductor substrate or a reticle where a plurality of charged particle beams are simultaneously applied equal can be generated. Therefore, the present invention is extremely effective in mass-producing semiconductor devices or the like.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. An exposure data generation method for generating exposure data for transferring a pattern by exposing a semiconductor substrate or a reticle by the use of a plurality of charged particle beams, the method comprising the steps of:

extracting layout data including a plurality of patterns as a plurality of blocks for cell projection exposure;

dividing the layout data among unit areas corresponding to a region on the semiconductor substrate or the reticle to which the plurality of charged particle beams are applied simultaneously;

calculating the number of shots of the plurality of charged particle beams in each of the unit areas on the basis of the plurality of blocks for cell projection exposure extracted; and selecting, in the case of the number of types of the plurality of blocks for cell projection exposure extracted being greater than a predetermined permissible number, a block for cell projection exposure that is the least effective in performing cell projection exposure from among a plurality of blocks for cell projection exposure included in a unit area where the number of shots calculated is the smallest, and deleting the block for cell projection exposure from all of the unit areas, wherein the calculating of the number of shots in each of the unit areas and the deleting of the block for cell projection exposure are repeated until the number of the types becomes equal to the permissible number.

2. The exposure data generation method according to claim 1, wherein the plurality of patterns or groups of patterns are extracted in descending order of repetitiveness as the plurality of blocks for cell projection exposure so that all of the plurality of patterns included in the layout data will be represented.

3. The exposure data generation method according to claim 1, wherein a pattern corresponding to one shot in variable rectangular exposure is excluded when the layout data is extracted as the plurality of blocks for cell projection exposure.

4. The exposure data generation method according to claim 1, wherein each of the unit areas is defined by a region on the semiconductor substrate or the reticle to which each of the plurality of charged particle beams is applied by a deflector in a multi-beam exposure apparatus or by distance between two adjacent charged particle beams.

5. The exposure data generation method according to claim 1, wherein the permissible number is the number of the plurality of blocks for cell projection exposure which can be formed on a mask or the number of the types of the plurality of blocks for cell projection exposure which can be stored as data in terms of capacity.

6. The exposure data generation method according to claim 1, wherein a block for cell projection exposure that minimizes the difference between the total number of shots in cell projection exposure performed on the semiconductor substrate or the reticle by using the block for cell projection exposure and the total number of shots in variable rectangular exposure performed on the semiconductor substrate or the reticle by using a pattern included in the block for cell projection exposure is considered to be the least effective in performing cell projection exposure.

7. An exposure data generation method for generating exposure data for transferring a pattern by exposing a semiconductor substrate or a reticle by the use of a plurality of charged particle beams, the method comprising the steps of:

dividing layout data including a plurality of patterns among unit areas corresponding to a region on the semiconductor substrate or the reticle to which the plurality of charged particle beams are applied simultaneously;

calculating the number of shots of the plurality of charged particle beams in each of the unit areas; and extracting a pattern or a pattern group of one type that minimizes the number of shots in a unit area in which the number of shots calculated is the greatest by being treated as a block for cell projection exposure from a plurality of patterns included in the unit area as the block for cell projection exposure, and extracting a block for cell projection exposure of the same type from another unit area including the extracted pattern or the extracted pattern group, wherein the calculating of the number of shots in each of the unit areas and the extracting of the block for cell projection exposure are repeated until the number of types of the blocks for cell projection exposure becomes equal to a permissible number.

8. The exposure data generation method according to claim 7, wherein each of the unit areas is defined by a region on the semiconductor substrate or the reticle to which each of the plurality of charged particle beams is applied by a deflector in a multi-beam exposure apparatus or by distance between two adjacent charged particle beams.

9. The exposure data generation method according to claim 7, wherein the permissible number is the number of the blocks for cell projection exposure which can be formed on a mask or the number of types of the blocks for cell projection exposure which can be stored as data in terms of capacity.

10. An exposure data generation method for generating exposure data for transferring a pattern by exposing a semiconductor substrate or a reticle by the use of a plurality of charged particle beams, the method comprising:

a first process including the steps of:

extracting layout data including a plurality of patterns as a plurality of blocks for cell projection exposure;

dividing the layout data among unit areas corresponding to a region on the semiconductor substrate or the reticle to which the plurality of charged particle beams are applied simultaneously;

calculating the number of shots of the plurality of charged particle beams in each of the unit areas on the basis of the plurality of blocks for cell projection exposure extracted; and selecting, in the case of the number of types of the plurality of blocks for cell projection exposure extracted being greater than a predetermined permissible number, a block for cell projection exposure that is the least effective in performing cell projection exposure from among a plurality of blocks for cell projection exposure included in a unit area where the number of shots calculated is the smallest, and deleting the block for cell projection exposure from all of the unit areas, wherein the calculating of the number of shots in each of the unit areas and the deleting of the block for cell projection exposure are repeated until the number of the types becomes equal to the permissible number; and a second process including the steps of:
- dividing the layout data among the unit areas;
- calculating the number of shots of the plurality of charged particle beams in each of the unit areas; and
- extracting a pattern or a pattern group of one type that minimizes the number of shots in a unit area in which the number of shots calculated is the greatest by being treated as a block for cell projection exposure from a plurality of patterns included in the unit area as the block for cell projection exposure, and extracting a block for cell projection exposure of the same type from another unit area including the extracted pattern or the extracted pattern group,
- wherein the calculating of the number of shots in each of the unit areas and the extracting of the block for cell projection exposure are repeated until the number of types of the blocks for cell projection exposure becomes equal to a permissible number, wherein:
the first process and the second process are performed in parallel; and
when the number of the types becomes equal to the permissible number in each process, the number of shots calculated for a unit area that is the greatest in the first process is compared with the number of shots calculated for a unit area that is the greatest in the second process and exposure data is generated on the basis of the blocks for cell projection exposure in one of the two processes in which the greatest number of shots is smaller.

11. An exposure data generation apparatus for generating exposure data for transferring a pattern by exposing a semiconductor substrate or a reticle by the use of a plurality of charged particle beams, the apparatus comprising:
- an extraction section for extracting layout data including a plurality of patterns as a plurality of blocks for cell projection exposure;
- a unit area division section for dividing the layout data among unit areas corresponding to a region on the semiconductor substrate or the reticle to which the plurality of charged particle beams are applied simultaneously;
- a shot number calculation section for calculating the number of shots of the plurality of charged particle beams in each of the unit areas on the basis of the plurality of blocks for cell projection exposure extracted; and
- a cell projection exposure block number control section for selecting, in the case of the number of types of the plurality of blocks for cell projection exposure extracted being greater than a predetermined permissible number, a block for cell projection exposure that is the least effective in performing cell projection exposure from among a plurality of blocks for cell projection exposure included in a unit area where the number of shots calculated is the smallest, and for deleting the block for cell projection exposure from all of the unit areas,
- wherein the calculating of the number of shots in each of the unit areas and the deleting of the block for cell projection exposure are repeated by the shot number calculation section and the cell projection exposure block number control section, respectively, until the number of the types becomes equal to the permissible number.

12. The exposure data generation apparatus according to claim 11, further comprising a plurality of processors each of which performs processes in each of the unit areas.

13. An exposure data generation apparatus for generating exposure data for transferring a pattern by exposing a semiconductor substrate or a reticle by the use of a plurality of charged particle beams, the apparatus comprising:
- a unit area division section for dividing layout data including a plurality of patterns among unit areas corresponding to a region on the semiconductor substrate or the reticle to which the plurality of charged particle beams are applied simultaneously;
- a shot number calculation section for calculating the number of shots of the plurality of charged particle beams in each of the unit areas; and
- an extraction section for extracting a pattern or a pattern group of one type that minimizes the number of shots in a unit area in which the number of shots calculated is the greatest by being treated as a block for cell projection exposure from a plurality of patterns included in the unit area as the block for cell projection exposure, and for extracting a block for cell projection exposure of the same type from another unit area including the extracted pattern or the extracted pattern group,
- wherein the calculating of the number of shots in each of the unit areas and the extracting of the block for cell projection exposure are repeated by the shot number calculation section and the extraction section, respectively, until the number of types of the blocks for cell projection exposure becomes equal to a permissible number.

14. The exposure data generation apparatus according to claim 13, further comprising a plurality of processors each of which performs processes in each of the unit areas.

* * * * *